(12) United States Patent
Herron

(10) Patent No.: US 6,797,401 B2
(45) Date of Patent: Sep. 28, 2004

(54) ELECTROMAGNETIC WAVE ABSORBING MATERIALS

(75) Inventor: Dale P. Herron, Los Angeles, CA (US)

(73) Assignee: Lockheed-Martin Corporation, Rockledge, MD (US)

(*) Notice: Subject to any disclaimer, the term of this patent is extended or adjusted under 35 U.S.C. 154(b) by 0 days.

(21) Appl. No.: 10/175,396

(22) Filed: Jun. 20, 2002

(65) Prior Publication Data

US 2003/0235709 A1 Dec. 25, 2003

(51) Int. Cl.[7] .......................... B22F 9/06; B32B 15/18; H01F 10/14; H01F 10/16; H01Q 17/00
(52) U.S. Cl. .................... 428/553; 428/560; 428/611; 428/692; 428/928; 428/937; 342/1; 342/2; 417/77; 417/78; 417/128
(58) Field of Search ................... 428/553, 560, 428/382, 407, 611, 692, 928, 937; 342/1, 2; 417/77, 78, 128

(56) References Cited

U.S. PATENT DOCUMENTS

| | | | | |
|---|---|---|---|---|
| 3,620,875 A | * | 11/1971 | Guglielmo et al. | ...... 156/272.4 |
| 5,208,091 A | * | 5/1993 | Yanagita et al. | ............ 428/141 |
| 5,525,988 A | * | 6/1996 | Perkins et al. | ................. 342/4 |
| 5,573,863 A | * | 11/1996 | Hayakawa et al. | ...... 428/694 T |
| 5,574,961 A | | 11/1996 | Edelstein et al. | |
| 5,833,770 A | * | 11/1998 | Ominato et al. | ............ 148/305 |
| 5,990,417 A | * | 11/1999 | Senda et al. | ........... 174/35 MS |
| 6,063,511 A | * | 5/2000 | Purinton et al. | ............ 428/692 |
| 6,410,847 B1 | * | 6/2002 | Allen et al. | ............ 174/35 MS |
| 6,521,829 B2 | * | 2/2003 | Matsumura et al. | ... 174/35 MS |

* cited by examiner

*Primary Examiner*—Deborah Jones
*Assistant Examiner*—Jason Savage
(74) *Attorney, Agent, or Firm*—Koestner Bertani LLP; Mary Jo Bertani

(57) ABSTRACT

Electromagnetic wave absorbing materials comprising magnetic alloy particles and an insulating matrix are disclosed. The magnetic alloy particles comprise a transition metal such as Fe and/or Co, and further comprise at least one refractory metal such as Ti, V, Cr, Zr, Nb, Mo, Hf, Ta and W. The magnet alloy particles may further include Ni and/or Al, or other alloying additions which provide the desired absorption characteristics. In a preferred embodiment, the magnetic alloy particles comprise an Fe—Cr—Ni—Al alloy. The insulating matrix of the electromagnetic wave absorbing material may comprise a water miscible polysilicate or a refractory cement. The materials may be provided in the form of coatings that are applied to a substrate, such as the hot engine exhaust area of an aircraft. The electromagnetic wave absorbing materials are capable of functioning at very high temperatures for extended periods of time while retaining satisfactory electromagnetic wave absorbing properties.

55 Claims, 6 Drawing Sheets

10,000X FIG. 3
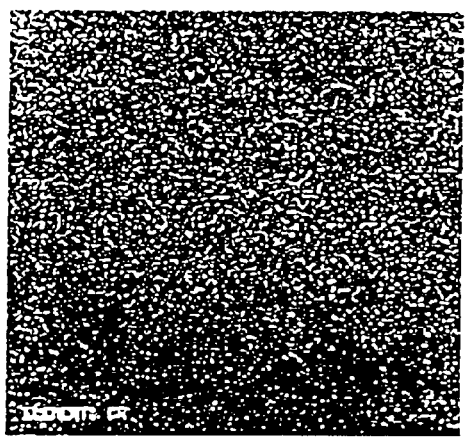
Chromium 10,000X
FIG. 4
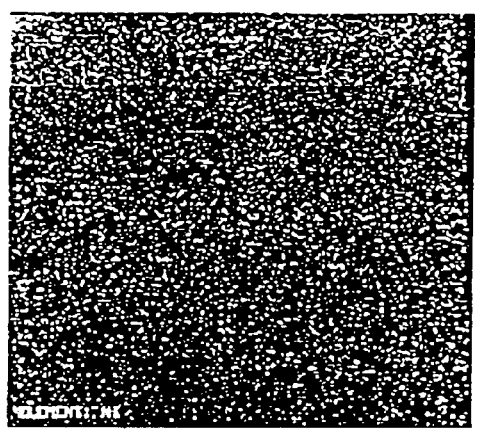
Nickel 10,000X
FIG. 5
Aluminum 10,000X
FIG. 6
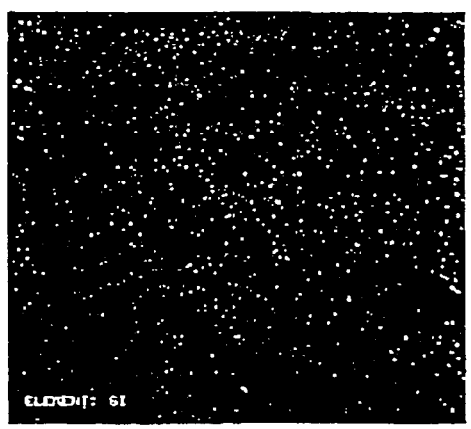
Silicon 10,000X
FIG. 7

ELECTROMAGNETIC WAVE ABSORBING MATERIALS

FIELD OF THE INVENTION

The present invention relates to low observable materials, and more particularly relates to electromagnetic wave absorbing materials comprising magnetic alloy particles and an insulating matrix. The materials may be used in the form of coatings for applications such as hot engine exhaust areas of aircraft.

BACKGROUND INFORMATION

Radar absorbing materials have been developed for various applications, such as for use in hot engine exhaust areas of aircraft. Iron powder has been proposed for radar absorbing coatings. However, iron is susceptible to oxidation at elevated temperatures, e.g., 1,100° F. and higher.

U.S. Pat. No. 5,574,961 to Edelstein et al. discloses a radar absorbing material comprising Fe and/or Co in combination with boron nitride.

Several methods of preparing and applying microwave absorbing materials currently exist. However, conventional materials require specialized equipment or procedures, and are not easily repairable in the field. Aircraft are often assigned to remote areas and require routine maintenance. Present methods require special equipment, facilities and trained personnel to apply materials.

An electromagnetic wave absorbing material that is capable of functioning at high temperatures would be desirable. Furthermore, an electromagnetic wave absorbing material that is relatively easy to apply to components would facilitate its use in controlled or remote locations.

The present invention has been developed in view of the foregoing, and to address other deficiencies of the prior art.

SUMMARY OF THE INVENTION

The present invention provides an electromagnetic wave absorbing material comprising magnetic alloy particles and an insulating matrix. The magnetic alloy particles comprise a transition metal such as Fe and/or Co, and further comprise at least one refractory metal such as Ti, V, Cr, Zr, Nb, Mo, Hf, Ta and W. The magnetic alloy particles may further include Ni and/or Al, or any other alloying additions which provide the desired absorption characteristics. In a preferred embodiment, the magnetic alloy particles comprise an Fe—Cr—Ni—Al alloy. The insulating matrix of the electromagnetic wave absorbing material may comprise a refractory cement. The material may be provided in the form of a coating which may be applied to a substrate, such as a hot engine exhaust area of an aircraft. The electromagnetic wave absorbing materials of the present invention are capable of functioning at very high temperatures for extended periods of time while retaining satisfactory electromagnetic wave absorbing properties.

Another embodiment of the present invention provides a method of making an electromagnetic wave absorbing material coating. The method includes the steps of mixing magnetic alloy particles and insulating matrix precursor particles, combining the mixture with a liquid such as water to form a slurry, and applying the slurry on a substrate. The slurry may be applied by spraying or the like.

An aspect of the present invention is to provide an electromagnetic wave absorbing structure comprising a substrate and an outer layer of electromagnetic wave absorbing material over at least a portion of the substrate. The electromagnetic wave absorbing material comprises an insulating matrix and magnetic alloy particles in the insulating matrix, the magnetic alloy particles comprising at least one transition metal selected from Fe and Co, and at least one refractory metal selected from Ti, V, Cr, Zr, Nb, Mo, Hf, Ta and W.

Another aspect of the present invention is to provide an electromagnetic wave absorber that is capable of performing electrically and structurally in an engine exhaust environment or the like.

A further aspect of the present invention is to provide small particle alloy powder that is substantially spherical, multi-grained and has desirable magnetic properties.

Another aspect of the present invention is to provide an electromagnetic wave absorbing material that is capable of operating in a broadband frequency range.

Another aspect of the present invention is to provide a radar absorbing material that will adhere structurally to typical aircraft engine components and the like.

A further aspect of the present invention is to provide a radar absorbing material that can function at high temperatures.

Another aspect of the present invention is to provide a radar absorbing coating that is capable of absorbing microwave energy at certain frequencies by controlling the proportion of magnetic alloy particles used in the coating and by controlling the final thickness of the coating.

A further aspect of the present invention is to provide a method of making an electromagnetic wave absorbing material coating. The method comprises mixing magnetic alloy particles and insulating matrix precursor particles, combining the mixture with a liquid to form a slurry, and applying the slurry on a substrate to form an exposed coating of electromagnetic wave absorbing material comprising the magnetic alloy particles in the insulating matrix.

These and other aspects of the present invention will be more apparent from the following description.

BRIEF DESCRIPTION OF THE DRAWINGS

FIG. 3 is a photomicrograph of the magnetic alloy particle cross-section of FIG. 2 at a magnification of 10,000×.

FIGS. 4–7 are four elemental maps of the same image of FIG. 3 outlining dispersions of the elements Cr, Ni, Al and Si, respectively, in solid solution.

DETAILED DESCRIPTION

Figure 1:
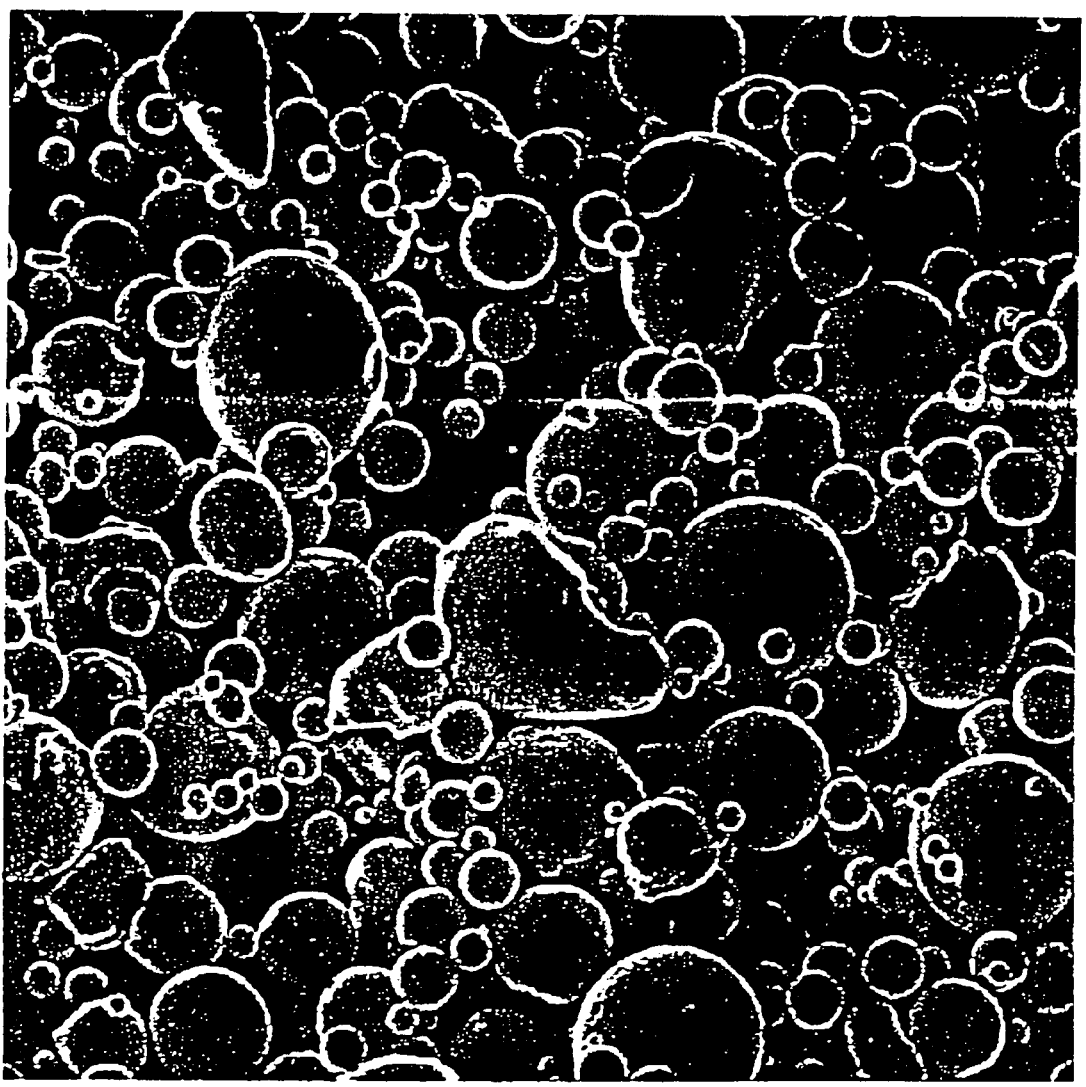
FIG. 1 is a photomicrograph of Fe—Cr—Ni—Al magnetic alloy particles in accordance with an embodiment of the present invention.

In accordance with an embodiment of the present invention, an electromagnetic wave absorbing material is provided. The electromagnetic wave absorbing material comprises magnetic alloy particles and an insulating matrix. The magnetic alloy particles preferably comprise from about 20 to about 90 weight percent of the electromagnetic wave absorbing material, while the insulating material preferably comprises from about 10 to about 70 weight percent of the material. More preferably, the magnetic alloy particles comprise from about 40 to about 70 weight percent of the electromagnetic wave absorbing material and the insulating matrix comprises from about 30 to about 60 weight percent of the material.

The magnetic alloy particles of the electromagnetic wave absorbing material comprise at least one transition metal selected from Fe and Co, and further comprise at least one refractory metal selected from Ti, V, Cr, Zr, Nb, Mo, Hf, Ta and W. The transition metal preferably comprises from about 60 to about 90 weight percent of the magnetic alloy particles. More preferably, the transition metal comprises from about 70 to about 80 weight percent of the magnetic alloy particles.

The transition metal component of the preferred magnetic alloy particles predominantly comprises Fe, i.e., the transition metal comprises at least about 50 weight percent iron. Iron is particularly preferred as the transition metal due to its high saturation magnetization properties. The transition metal may optionally include Co in an amount sufficient to achieve the desired properties. For example, Co additions may increase the Curie temperature of the magnetic alloy particles.

The refractory metal of the magnetic alloy particles includes at least one element selected from Ti, V, Cr, Zr, Nb, Mo, Hf, Ta and W. Preferably, the refractory metal comprises Cr, V or Nb. In a particularly preferred embodiment, the refractory metal comprises Cr. The refractory metal preferably comprises from about 5 to about 20 weight percent of the magnetic alloy particles, more preferably from about 8 to about 15 weight percent. In accordance with the present invention, the refractory metal, such as Cr, improves the properties of the magnetic alloy particles by increasing high temperature oxidation resistance. Furthermore, the refractory metal may increase the strength of the alloy.

In addition to the transition metals and refractory metals, the magnetic alloy particles may further comprise Ni. In this embodiment, the Ni typically comprises from about 1 to about 10 weight percent of the magnetic alloy particles. Preferably, the Ni comprises from about 2 to about 7 weight percent of the magnetic alloy particles, more preferably from about 2 to about 5 weight percent. The addition of nickel may increase the hardness of the alloy. Furthermore, nickel may increase oxidation resistance by producing a tightly adherent scale. For example, when nickel is alloyed with aluminum, a hard alloy is formed which retains its hardness at elevated temperatures.

The magnetic alloy particles may further comprise at least one metal selected from Group IIIA of the Periodic Table. For example, the magnetic alloy particles may include Al and/or B alloying additions. Aluminum is particularly preferred alloying addition in an amount from about 1 to about 10 weight percent. Preferably the Al comprises from about 2 to about 7 weight percent of the magnetic alloy particles, more preferably from about 3 to about 6 weight percent. The addition of aluminum may increase oxidation resistance and improve high temperature properties. For example, when aluminum is added to a Fe—Cr—Ni alloy, the critical temperature of the alloy may be increased significantly. Furthermore, the addition of aluminum produces a thin oxide surface film, which increases the oxidation resistance of the alloy.

Magnetic alloy particles comprising Fe, Cr, Ni and/or Al provide favorable electromagnetic wave absorbing properties in accordance with a preferred embodiment of the present invention. For example, a suitable magnetic alloy comprises from about 5 to about 20 weight percent Cr, from about 1 to about 10 weight percent Ni, from about 1 to about 10 weight percent Al, and the balance Fe and incidental impurities. In a preferred embodiment, the magnetic alloy comprises from about 8 to about 15 weight percent Cr, from about 2 to about 7 weight percent Ni, from about 2 to about 7 weight percent Al, and the balance Fe and incidental impurities. In a more preferred embodiment, the magnetic alloy comprises from about 9 to about 11 weight percent Cr, from about 4 to about 6 weight percent Ni, from about 4 to about 6 weight percent Al, and the balance Fe. These typical, preferred and more preferred compositional ranges are shown below in Table 1. Although ferrous alloys including Cr, Ni and Al alloying additions are primarily described herein, it is to be understood that other magnetic alloys comprising Fe and/or Co in combination with various refractory metals and other alloying additions are within the scope of the present invention.

TABLE 1

Compositions of Fe—Cr—Ni—Al Alloys (Weight %)

| | Fe | Cr | Ni | Al |
|---|---|---|---|---|
| Typical | balance | 5–20 | 1–10 | 1–10 |
| Preferred | balance | 8–15 | 2–7 | 2–7 |
| More Preferred | balance | 9–11 | 4–6 | 4–6 |

In addition to the elements listed in Table 1, the preferred Fe—Cr—Ni—Al alloy may further comprise a maximum of about 2 weight percent Si, about 1 weight percent Mn, about 0.1 weight percent C, and about 0.03 weight percent S. For example, the Fe—Cr—Ni—Al alloy may comprise about 0.4 weight percent Si, about 0.07 weight percent Mn, about 0.025 weight percent C, and about 0.009 weight percent S.

The electromagnetic wave absorbing materials of the present invention may optionally include a filler material. The type of filler used may be determined by the service temperature of the material. Typical fillers include carbon microspheres, hollow and solid alumina microspheres, hollow glass microballoons, pyrex glass powder and hydrated alumina. The temperature capability ranges from about 1,100° F. to 1,400° F. for the carbon microspheres to about 3,000° F. for the alumina products. Other factors used in selecting an appropriate filler are weight specifications for the coating, thickness, and electrical and structural requirements. The amount of optional filler preferably ranges from about 0.5 to about 5 weight percent of the electromagnetic wave absorbing material.

The size of the magnetic alloy particles of the present invention is preferably controlled in order to provide suitable electromagnetic wave absorbing characteristics. For example, the magnetic alloy particles preferably have an average particle size of from about 1 to about 50 microns, more preferably from about 5 to about 20 microns. For example, an average particle size of 10 μm may be suitable for many applications.

The magnetic alloy particles of the present invention may be provided in any desired shape. For example, the magnetic alloy particles may be substantially spherical, flakes or grains. In a preferred embodiment, the magnetic alloy particles are substantially spherical.

The present magnetic alloy particles are preferably multi-grained. Thus, each particle preferably comprises multiple crystal grains. Furthermore, the magnetic alloy particles may also comprise a solid solution of the elemental constituents. For example, the magnetic alloy particles may comprise a solid solution of the transition metal and the refractory metal as a particular example. As a particular example, the magnetic alloy particles may comprise a solid solution of Fe, Cr, Ni, and Al.

In addition to the magnetic alloy particles, the electromagnetic wave absorbing materials of the present invention include an insulating matrix. The insulating matrix may be any material which provides the desired amount of electrical insulation between the magnetic alloy particles. Various types of insulating materials are suitable, including refractory cements, liquid silicates and plasma sprayed ceramics. Suitable commercially available refractory cements include Dylon C-3, Cerama Bond and Ceram Guard. Suitable silicates include water miscible polysilicates.

In accordance with an embodiment of the present invention, the electromagnetic wave absorbing material is provided in the form of a coating. The thickness is preferably selected in order to provide the desired electromagnetic wave absorbing characteristics. For example, a coating thickness of from about 20 to about 100 mils may be preferred for many applications, more preferably from about 40 to about 70 mils.

In accordance with an embodiment of the present invention, the desired coating thickness may be selected, for example, by matrixing different weight percentages of the magnetic alloy particles with different coating thicknesses, e.g., 40 mils, 50 mils and 60 mils. A coating thickness of from about 50 mils may be preferred to many applications in order to provide favorable quarter wavelength absorbing characteristics.

Since magnetic properties typically change with temperature, it is desirable to have the proper magnetic properties at the service temperature of the material. For example, to be effective as a high temperature engine exhaust radar absorbing material (RAM), the material should function at a temperature of from about 400 to 600° C., and should be able to survive afterburner temperatures of from about 1,100 to 1,200° C. In addition to extreme temperatures, the forces of dynamic exhaust gas impingement and acoustic vibrations are also exerted on the material. Furthermore, low observable materials should maintain satisfactory absorbance of energy in the desired band, e.g., a conventional 2–18 GHz microwave threat band or the like.

The preferred Fe—Cr—Ni—Al alloy of the present invention may be produced by adding the desired weight percent of all of the elements, and melting in an inert atmosphere until all components are a homogeneous mixture. The material may then be atomized by, e.g., an inert gas into a suitable collection chamber. One embodiment of the present invention utilizes Fe—Cr—Ni—Al alloy powder prepared by means of conventional inert gas atomization. The alloy powder may be combined with a binder such as polysilicate refractory cement and water to a slurry consistency and sprayed onto the metal surface. The magnetic alloy particles may be suspended in the binder by mixing and thinning with a liquid such as water. This not only facilitates ease of application with conventional spray equipment, but it also allows repairs in the field to be easily done if needed.

The coating may be applied to the substrate by spraying. For example, once thinned to a spray consistency, the coating may be sprayed onto a previously cleaned metal substrate (e.g., grit blasting followed by scrubbing and a final water rinse). The coating may alternatively be applied by brushing. The coating is typically applied in 6 to 10 mil dry film thicknesses followed by a 1 hour air dry and a 1 hour bake at 250° F. Subsequent coats are applied, dried and baked until the desired thickness is achieved.

The following examples illustrate various aspects of the present invention, and are not intended to limit the scope thereof.

EXAMPLE 1

A powder comprising magnetic alloy particles is prepared as follows. The alloy was made by melting the appropriate amounts of metal powders in an inert (argon) gas atmosphere. The iron and (helium) nickel powder are melted first because of their higher melting points. After blending to a homogenous state, the chromium is added along with a small amount of silicon to prevent the "sticky" nature of chromium and help with its dispersion in the iron/nickel mixture. The aluminum is added last because of its lower melting point and a tendency to partially vaporize if the temperature of the mixture is too high. Once the mixture has blended, it is gas atomized into an inert gas filled collection chamber. The resultant magnetic alloy particles were chemically analyzed. The results of the analysis are shown in Table 2.

TABLE 2

Alloy Specification and Chemical Analysis of Fe—Cr—Ni—Al Alloy

| Element | Weight Percent | Atomic Percent |
|---|---|---|
| Fe | 78.33 | 73.47 |
| Cr | 10.93 | 11.01 |
| Ni | 5.01 | 4.47 |
| Al | 4.69 | 9.10 |
| Si | 1.05 | 1.96 |

In FIG. 1, the SEM photomicrograph of the Fe—Cr—Ni—Al alloy at a magnification of 1,000× shows the spherical shape of the alloy and particle size distribution of the alloy powder ($1.38 \times 10^{-4}$ through $6.24 \times 10^{-4}$). The powder has a particle dispersion percentile of 10 percent passing 5.38 microns, 50 percent passing 12.42 microns and 90 percent passing 21.42 microns. Particle sizes were determined using a L & N Microtrac, Model #7995 Standard Range Analyzer and a Model #7997 Small Particle Analyzer. While not intending to be bound by any particular theory, the different alloy powder sizes may enhance the effect of the electromagnetic wave absorbance by helping redirect or cancel incoming microwave energy. Particles that are too small in size could potentially touch and form conducting paths (paramagnetism) which negates the absorbent effect of the material. Insulating the Fe—Cr—Ni—Al in an insulating matrix such as powdered refractory cement in accordance with the present invention not only provides improved absorbance, but also provides a practical way of application using conventional spray equipment and good adhesion to typical aircraft engine metals.

Figure 2:
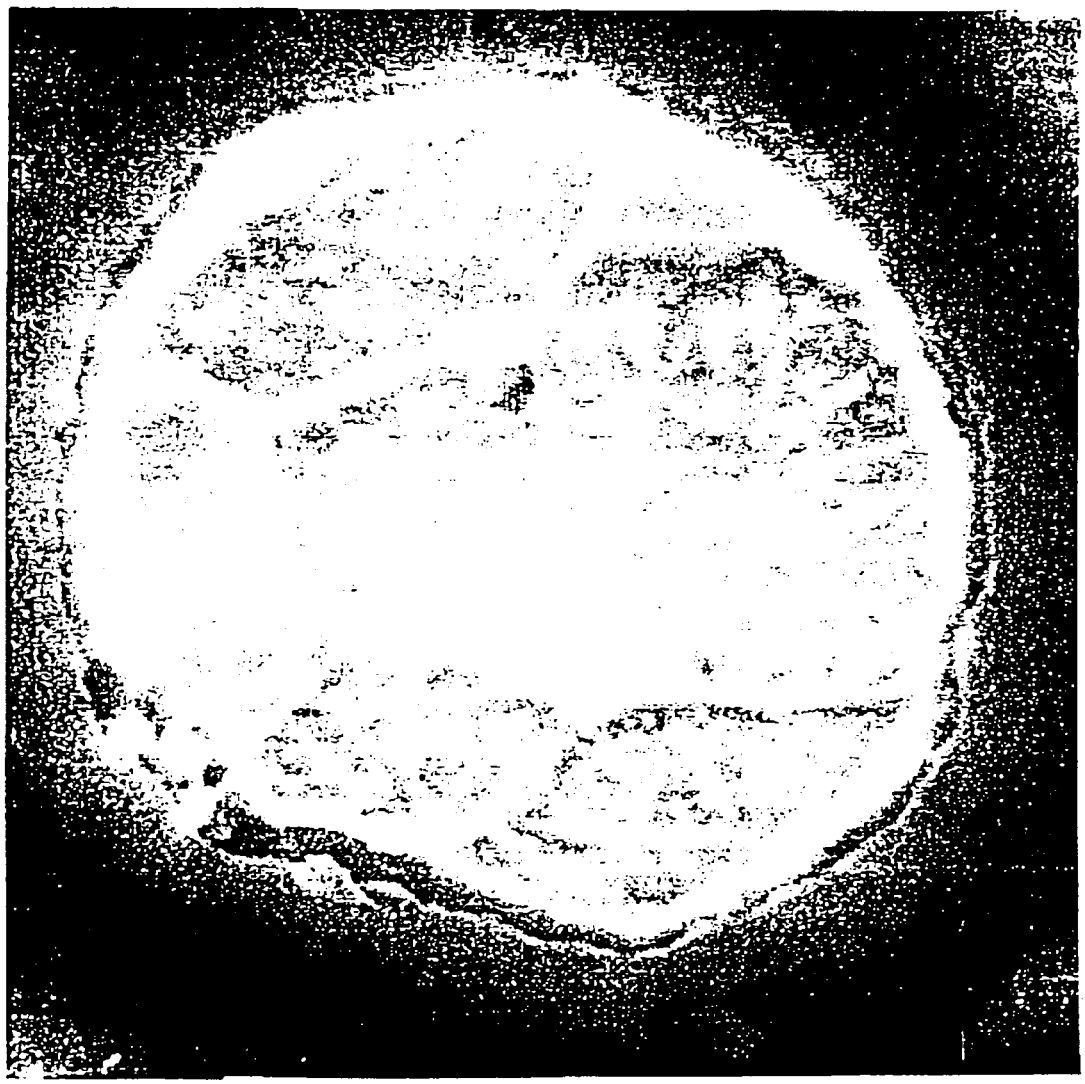
FIG. 2 is a photomicrograph of a polished and etched magnetic alloy particle cross-section at a magnification of 4,000× in accordance with an embodiment of the present invention.

FIG. 2 shows a polished and etched cross-section of an Fe—Cr—Ni—Al alloy sphere of the present invention, revealing the grain boundaries and crystalline structure. The crystallographic orientation may affect the magnetic characteristics of the material. The material is comprised of generally spherical metal particles with a crystalline structure, which may provide a coercivity mechanism of the single-domain particle type.

In FIG. 3, the magnification of 10,000× is of the same alloy sphere cross-section in FIG. 2. FIGS. 4–7 are four elemental maps of the image of FIG. 3, showing the dispersion of the elements Cr, Ni, Al and Si, respectively, in solid solution. The aluminum elemental map of FIG. 6 displays a faint outline of the grain boundaries, which may be due to a lack of aluminum or very little aluminum existing within the grain boundaries. The aluminum may provide a thin oxide layer to the other elements when alloyed.

EXAMPLE 2

Coatings were tested at 40, 50 and 60 weight percent magnetic alloy particles, with the remainder of each being refractory cement. The magnetic alloy particles had a composition of 78.33 weight percent Fe, 10.93 weight percent Cr, 5.01 weight percent Ni, 4.69 weight percent Al, and 1.05 weight percent Si, as shown in Table 2. The refractory cement comprises 60, 50 and 40 weight percent. The ferrous alloy and refractory cement mixtures were applied to three test panels at 40 mils, 50 mils and 60 mils, for a matrix total of nine variations. The metal substrates consisted of those typically found in jet exhaust systems, Rene 41, Haynes 188, Inconel 625 and 718, and Hastelloy X. For the sake of continuity, Inconel 625 was selected as the test metal substrate.

The coatings were all made in 3,000 gram batches and V blended for 1 hour. Each batch was sealed in a container and used in 500 gram increments for coating application. Each coating was made by adding a maximum of 25 weight percent distilled water to each 500 gram sample of blended powder to a spray consistency. The mix was strained through wire mesh screen into a Binks pressure pot with a minimum line pressure of 75 psi min and with the pot pressure set at 10 psi. Each coating was sprayed onto 2×2 inch flat tensile coupons, and onto 18×20 inch hot naval arch test panels. After airdrying for 1 hour, each coating was baked 1 hour at 250° F. to remove any water remaining in the coating. Additional coatings were measured, mixed and applied with a 4 hour minimum air dry, followed by a 1 hour bake at 250° F. to remove residual water until the desired thickness is achieved. Each coating was then given a final cure to 600° F. for 4 hours.

After continuous exposure at 1,100° F. for 10 hours, the test panels were allowed to cool before removal from the oven. The panels were then tested on a hot naval arch at 60° forward scatter using an HP network analyzer. The instrument was calibrated to zero using a bare metal test panel, then each coating was measured from room temperature to 1,100° F. throughout the 2–18 GHz frequency band. Data was recorded at selected temperatures of room temperature, 400° F., 700° F. and 1,100° F. Success or failure was determined if absorbance was greater than 5 db minimum at critical frequencies. If the absorbance was satisfactory, the test panel and flatwise test coupons were cycled at 1,100° F. for 100 hour increments until failure occurred or until the targeted service life of 500 hours. Failure was defined as either structural (loss of adhesion, cracks, etc.) or electrical (unsatisfactory radar microwave absorbance).

The coatings exhibited absorbance of 10 dB or greater after 500 hours total at 1,100° F. from 2–18 GHz frequency range. Flat tensile values after exposure to 1,100° F. for 500 hours ranged between 1,300 to 1,500 psi. This is an indication of a durable absorbent RAM coating.

Figure 8:
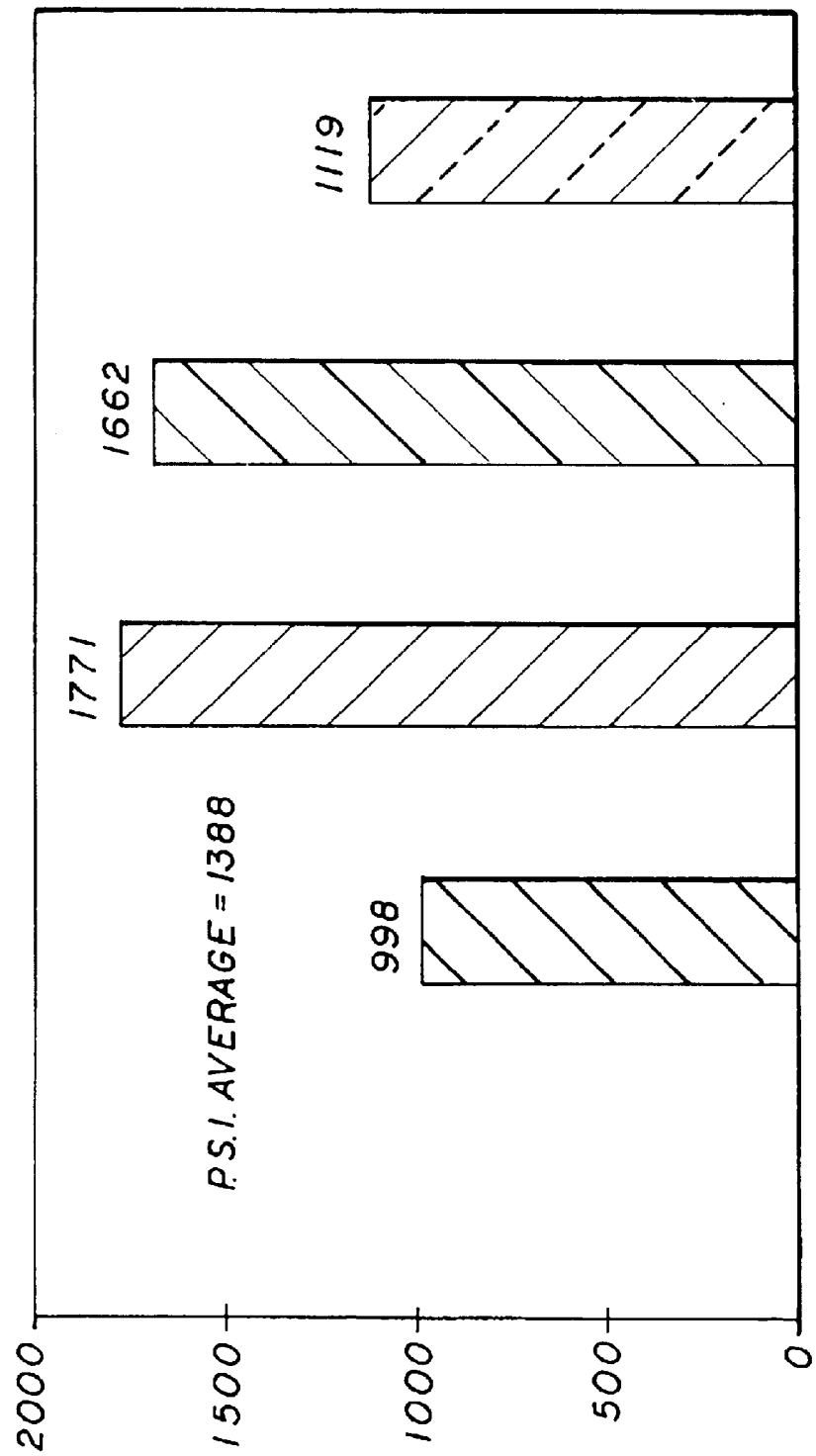
FIG. 8 is a graph of flatwise tensile (FWT) values for a coating of the present invention.

FIG. 8 shows the recorded psi values for the Fe—Cr—Ni—Al alloy coating after a 600° F. final bake and a 1,100° F. service temperature. Tensile strengths may double after exposure to service temperatures of 1,100° F. or higher. Electromagnetic performance was not diminished after a short exposure of 10 hours at 1,400° F.

Figure 9:
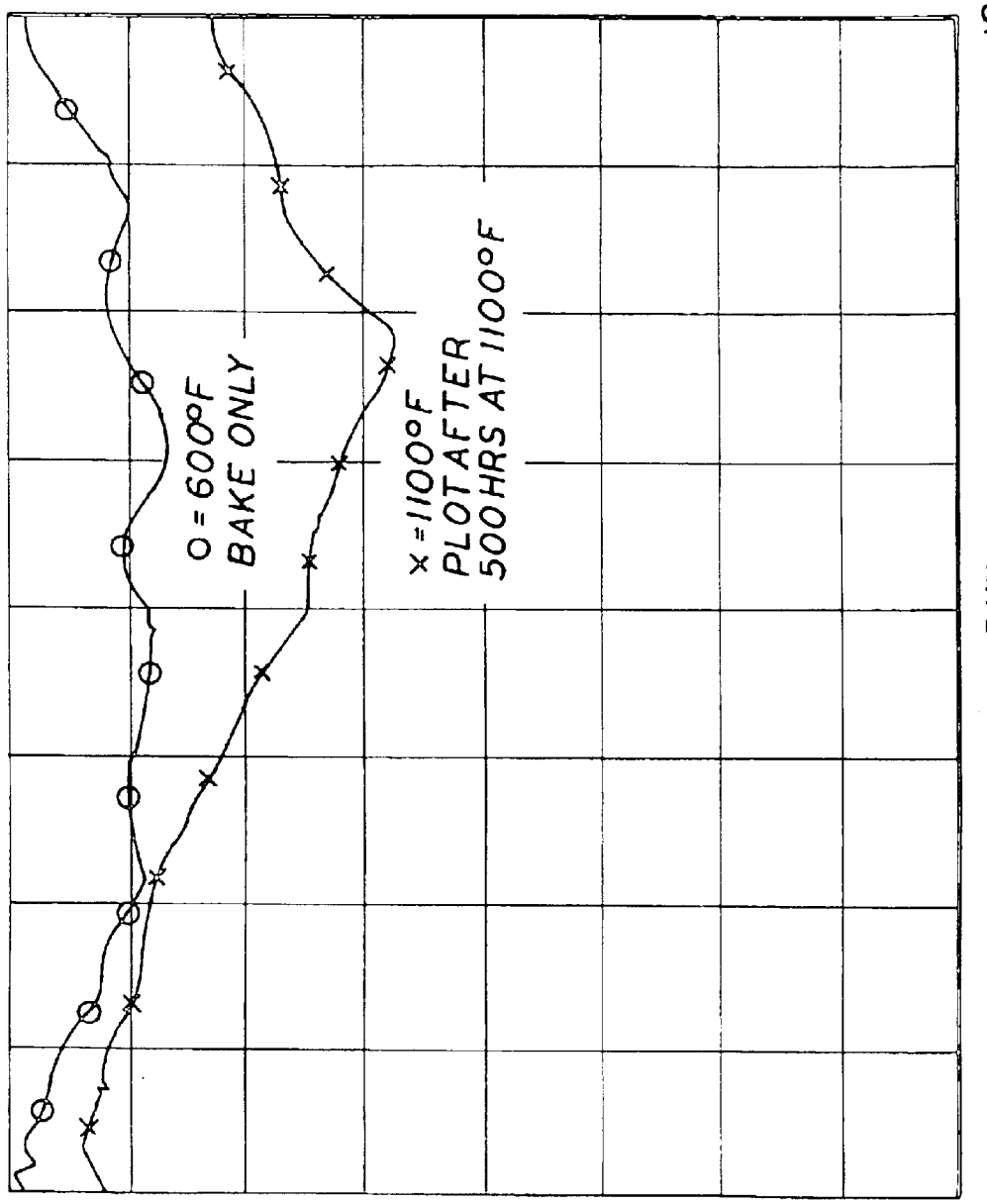
FIG. 9 is a forward scatter plot of a coating of the present invention at a temperature of 1,100° F. after selected 100 hour intervals.

In FIG. 9, the absorbance values in dB are recorded after 500 hours exposure at 1,100° F. The plot shows the difference in absorbance from room temperature (78° F.) to 1,100° F. The present alloy coatings preferably survive for 1,000 hours or more at such elevated temperatures. Most aircraft exhaust parts are replaced long before then. As noted previously, the absorption properties of the Fe—Cr—Ni—Al alloy may be controlled by thickness and weight percent of the alloy. The dB values are adjustable to meet the users requirements.

Figure 10:
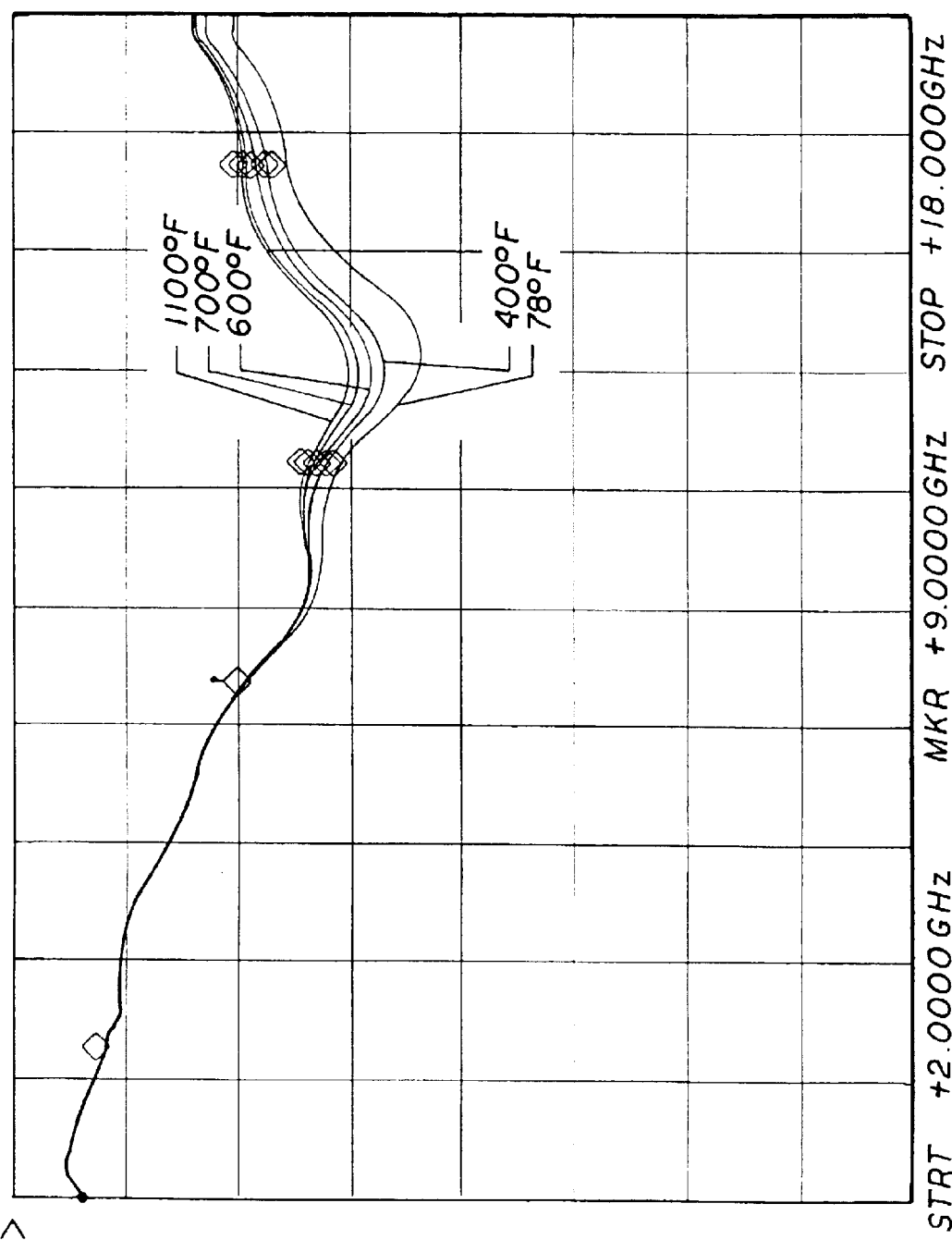
FIG. 10 is a 60° forward scatter plot for an electromagnetic wave absorbing material coating of the present invention at various temperatures, illustrating favorable microwave radiation absorbance characteristics.

The reported dB values are verified by duplicating the formulation and applying it to the same thickness (47 mils). The coating is cured and heat soaked at 100 hour intervals at 1,100° F. FIG. 10 shows a 60° forward scatter plot of the coating at various temperatures from 78° F. to 1,100° F. The results are repeatable for microwave radiation absorbance of an average of 10 dB at critical frequencies in the 2–18 GHz band.

Alternative alloys and combinations of alloys include the following: FeCoV, FeCrAl, FeCoAl, FeCrNi, NM-100, SS431, $Fe_2O_3$, Wright's magnetic pigment, FeCrMn, and glass coated iron. Alloys that performed electromagnetically at elevated temperatures were generally between 50 mils and 60 mils thick. Better absorbance was observed when weight percentages were above about 50 percent. The absorption, to a good approximation, scales with the imaginary part of the magnetic permeability ($\mu''$) for a given thickness and is almost independent of the dielectric constant ($\in$).

When absorption was a noted property of a given alloy, it was further evaluated to establish its characteristics and potential to absorb microwave energy at certain frequencies at elevated temperatures of 1,100° F. and higher. This may be accomplished by increasing the thickness of the coating or the weight percent of the alloy, or by combining it with another electromagnetic material such as another alloy, and re-measuring the modified material for absorbance. For instance, when Fe—Cr—Ni alloy powder was evaluated and certain responses were noted at a certain temperature for a given frequency, it was combined with Fe—Cr—Al alloy powder which had different responses at the same temperature and frequency to create a modified alloy material having different properties than either of the two alloys used to create it.

If improvements were made in absorbance, it was noted at which frequencies best performance occurred, at what coating thickness was the performance stable, were these results repeatable, the composition of the tested material, and the weight percentages of the constituents of the material. As data was collected and compiled, the elements Cr, Ni and Al were identified as preferred constituents of the alloy with superior electromagnetic properties. In accordance with the present invention, other alloy formulations may be created by following the aforementioned procedures.

The microwave energy absorbing coatings of the present invention are relatively inexpensive, easily applied and have demonstrated performance at elevated temperatures of 1,100° F. for 500 hours minimum.

Whereas particular embodiments of this invention have been described above for purposes of illustration, it will be evident to those skilled in the art that numerous variations of the details of the present invention may be made without departing from the invention as defined in the appended claims.

What is claimed is:

1. An electromagnetic wave absorbing structure comprising:
   a substrate; and
   an outer layer of electromagnetic wave absorbing material over at least a portion of the substrate, wherein the electromagnetic wave absorbing material comprises:
   (a) an insulating matrix; and
   (b) magnetic alloy particles in the insulating matrix, the magnetic alloy particles comprising at least one transition metal selected from Fe and Co, and at least one refractory metal selected from Ti, V, Cr, Zr, Nb, Mo, Hf, Ta and W and at least one metal selected from Group IIIA of the Periodic Table wherein the at least one transition metal comprises from about 60 to about 90 weight percent of the magnetic alloy particles.

2. The electromagnetic wave absorbing structure of claim 1, wherein the magnetic alloy particles comprise from about 20 to about 90 weight percent of the material.

3. The electromagnetic wave absorbing structure of claim 1, wherein the magnetic alloy particles comprise from about 40 to about 70 weight percent and the insulating matrix comprises from about 30 to about 60 weight percent of the material.

4. The electromagnetic wave absorbing structure of claim 1, wherein the at least one transition metal comprises from about 70 to about 80 weight percent and the at least one refractory metal comprises from about 5 to about 20 weight percent of the magnetic alloy particles.

5. The electromagnetic wave absorbing structure of claim 4, wherein the at least one refractory metal comprises from about 8 to about 15 weight percent of the magnetic alloy particles.

6. The electromagnetic wave absorbing structure of claim 1, wherein the transition metal comprises at least about 50 weight percent Fe.

7. The electromagnetic wave absorbing structure of claim 1, wherein the transition metal comprises Fe.

8. The electromagnetic wave absorbing structure of claim 1, wherein the refractory metal comprises Cr, V or Nb.

9. The electromagnetic wave absorbing structure of claim 1, wherein the refractory metal comprises Cr.

10. The electromagnetic wave absorbing structure of claim 1, wherein the magnetic alloy particles further comprise Ni.

11. The electromagnetic wave absorbing structure of claim 10, wherein the Ni comprises from about 1 to about 10 weight percent of the magnetic alloy particles.

12. The electromagnetic wave absorbing structure of claim 10, wherein the Ni comprises from about 2 to about 7 weight percent of the magnetic alloy particles.

13. The electromagnetic wave absorbing structure of claim 10, wherein the Ni comprises from about 4 to about 6 weight percent of the magnetic alloy particles.

14. The electromagnetic wave absorbing structure of claim 1, wherein the magnetic alloy particles further comprise Al.

15. The electromagnetic wave absorbing structure of claim 14, wherein the Al comprises from about 1 to about 10 weight percent of the magnetic alloy particles.

16. The electromagnetic wave absorbing structure of claim 14, wherein the Al comprises from about 2 to about 7 weight percent of the magnetic alloy particles.

17. The electromagnetic wave absorbing structure of claim 14, wherein the Al comprises from about 4 to about 6 weight percent of the magnetic alloy particles.

18. The electromagnetic wave absorbing structure of claim 1, wherein the magnetic alloy particles comprise Fe and Cr.

19. The electromagnetic wave absorbing structure of claim 1, wherein the magnetic alloy particles comprise Fe, Cr and Ni.

20. The electromagnetic wave absorbing structure of claim 1, wherein the magnetic alloy particles comprise Fe, Cr and Al.

21. The electromagnetic wave absorbing structure of claim 1, wherein the magnetic alloy particles comprise Fe, Cr, Ni and Al.

22. The electromagnetic wave absorbing structure of claim 21, wherein the magnetic alloy particles comprise from about 5 to about 20 weight percent Cr, from about 1 to about 10 weight percent Ni, and from about 1 to about 10 weight percent Al.

23. The electromagnetic wave absorbing structure of claim 21, wherein the magnetic alloy particles comprise from about 8 to about 15 weight percent Cr, from about 2 to about 7 weight percent Ni, and from about 2 to about 7 weight percent Al.

24. The electromagnetic wave absorbing structure of claim 21, wherein the magnetic alloy particles comprise from about 9 to about 11 weight percent Cr, from about 4 to about 6 weight percent Ni, and from about 4 to about 6 weight percent Al.

25. The electromagnetic wave absorbing structure of claim 1, wherein the magnetic alloy particles have an average size of from about 1 to about 50 microns.

26. The electromagnetic wave absorbing structure of claim 1, wherein the magnetic alloy particles have an average size of from about 5 to about 20 microns.

27. The electromagnetic wave absorbing structure of claim 1, wherein the magnetic alloy particles are substantially spheroidal in shape.

28. The electromagnetic wave absorbing structure of claim 1, wherein the magnetic alloy particles are polycrystalline.

29. The electromagnetic wave absorbing structure of claim 1, wherein the magnetic alloy particles comprise a solid solution of the at least one transition metal and the at least one refractory metal.

30. The electromagnetic wave absorbing structure of claim 1, wherein the insulating matrix comprises a refractory cement.

31. The electromagnetic wave absorbing structure of claim 1, wherein the insulating matrix comprises water miscible polysilicate.

32. The electromagnetic wave absorbing structure of claim 1, wherein the material is in the form of a coating.

33. The electromagnetic wave absorbing structure of claim 32, wherein the coating has a thickness of from about 20 to about 100 mils.

34. The electromagnetic wave absorbing structure of claim 33, wherein the coating has a thickness of from about 40 to about 70 mils.

35. The electromagnetic wave absorbing structure of claim 32, wherein the coating is capable of surviving at a temperature of 1,100° F. for at least about 500 hours.

36. The electromagnetic wave absorbing structure of claim 33, wherein the coating is capable of absorbing microwave energy at a temperature of 1,100° F. for at least about 500 hours.

37. The electromagnetic wave absorbing structure of claim 1, wherein the substrate comprises metal.

38. The electromagnetic wave absorbing structure of claim 1, wherein the substrate comprises an aircraft component.

39. A method of making an electromagnetic wave absorbing material coating comprising:
mixing magnetic alloy particles and insulating matrix precursor particles, wherein the insulating matrix precursor particles include a refractory cement;
combining the mixture with a liquid to form a slurry; and
applying the slurry on a substrate to form an exposed coating of electromagnetic wave absorbing material comprising the magnetic alloy particles in the insulating matrix.

40. The method of claim 39, wherein the magnetic alloy particles comprise at least one transition metal selected from Fe and Co, and at least one refractory metal selected from T, V, Cr, Zr, Nb, Mo, Hf, Ta and W.

41. The method of claim 39, wherein the insulating matrix comprises water miscible polysilicate.

42. The method of claim 39, wherein the liquid comprises water.

43. The method of claim 39, wherein the substrate comprises metal.

44. The method of claim 39, wherein the substrate comprises an aircraft component.

45. The method of claim 39, further comprising applying the slurry on the substrate by spraying.

46. The method of claim 39, further comprising applying the slurry on the substrate to form a coating having a thickness of from about 20 to about 100 mils.

47. The method of claim 39, further comprising drying the slurry after it is applied on the substrate.

48. An apparatus comprising:
electromagnetic wave absorbing material including:
an insulating matrix, wherein the insulating matrix includes water miscible polysilicate; and
magnetic alloy particles in the insulating matrix, the magnetic alloy particles comprising at least one transition metal selected from Fe and Co; and at least one refractory metal selected from Ti, V, Cr, Zr, Nb, Mo, Hf, Ta W, and Al.

49. The apparatus of claim 48, wherein the electromagnetic wave absorbing material resists oxidation at temperatures above approximately 400 degrees Fahrenheit.

50. The apparatus of claim 48, wherein the magnetic alloy particles comprises from about 20 to about 90 weight percent and the insulating matrix comprises from about 30 to about 60 weight percent of the material.

51. The apparatus of claim 48, wherein the at least one transition metal comprises from about 60 to about 90 weight percent and the at least one refractory metal comprises from about 5 to about 20 weight percent of the magnetic alloy particles.

52. The apparatus of claim 48 wherein the transition metal comprises at least about 50 weight percent Fe.

53. The apparatus of claim 48, wherein the magnetic alloy particle includes from about 5 to about 20 weight percent Cr, from about 1 to about 10 weight percent Ni, and from about 1 to about 10 weight percent Al.

54. The apparatus of claim 48, wherein the insulating matrix comprises at least one of: a refractory cement, a water miscible polysilicate, and a ceramic.

55. The apparatus of claim 48, wherein the material is in the form of coating.

* * * * *